Figure 1:
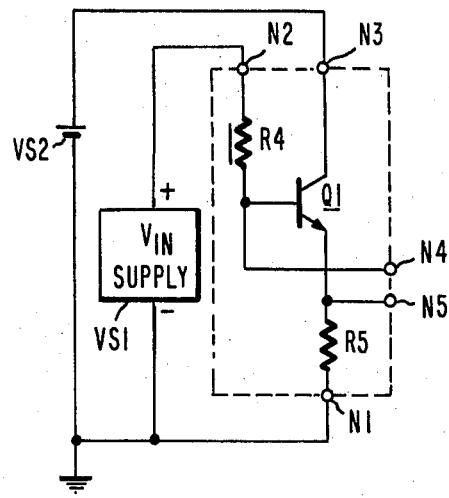

United States Patent [19]

Malchow

[11] 4,295,088
[45] Oct. 13, 1981

[54] TEMPERATURE-SENSITIVE VOLTAGE DIVIDER

[75] Inventor: Max E. Malchow, Raritan Township, Somerset County, N.J.

[73] Assignee: RCA Corporation, New York, N.Y.

[21] Appl. No.: 113,372

[22] Filed: Jan. 18, 1980

Related U.S. Application Data

[63] Continuation-in-part of Ser. No. 968,443, Dec. 11, 1978.

[51] Int. Cl.³ .............................................. G05F 3/20
[52] U.S. Cl. .................................. 323/313; 323/303; 307/310
[58] Field of Search ............ 307/297, 310; 323/94 R, 323/8; 357/51

[56] References Cited

U.S. PATENT DOCUMENTS

| | | | |
|---|---|---|---|
| 3,715,609 | 2/1973 | Hallen | 307/310 |
| 3,828,241 | 8/1974 | Horichi | 307/310 X |
| 3,851,190 | 11/1974 | Hongu et al. | 307/310 |
| 4,173,734 | 11/1979 | Hirasawa et al. | 323/8 |

OTHER PUBLICATIONS

*International Solid State Circuits Conference Digest of Technical Papers,* pp. 100, 101, 1963.
*Integrated Electronics,* H.C. Lin, pp. 359-362, 1967, Holden-Day Publishers.
Fairchild Semiconductor Linear Integrated Circuits Applications Handbook, pp. 15-16.

*Primary Examiner*—William M. Shoop
*Attorney, Agent, or Firm*—Paul J. Rasmussen; Allen L. Limberg; Allan J. Jacobson

[57] ABSTRACT

A temperature-sensitive voltage divider for monolithic i.c.'s using singly and doubly diffused resistors avoids the problems with tracking their resistance characteristics owing to diffusion process variations. This is done by using the pinch resistor in conjunction with the base-emitter circuit of a bipolar transistor arranged in common-collector amplifier configuration. The impedance transformation properties of the transistor ease the problems of scaling otherwise encountered in many potential divider arrangements of supply and doubly diffused resistors. The utility of the voltage divider is illustrated in the shunt regulation of the operating voltage of an AM radio receiver.

6 Claims, 6 Drawing Figures

TEMPERATURE-SENSITIVE VOLTAGE DIVIDER

This application is a continuation-in-part of United States Patent Application Ser. No. 968,443 filed Dec. 11, 1978.

The present invention relates to temperature-sensitive voltage dividers.

It is known in the art of monolithic integrated-circuit hearing aid amplifier design that one can provide current-mode biasing to a grounded-emitter transistor amplifier by applying a fixed voltage to its base electrode through a so-called "pinch" resistor, more particularly the "base pinch" resistor described on pages 102 and 103 of the book, *ANALYSIS AND DESIGN OF ANALOG INTEGRATED CIRCUITS*, by Paul R. Gray and Robert G. Meyer, published by John Wiley & Sons, New York. The "pinch" resistor is a doubly-diffused resistor, the body of which is formed in conventional monolithic i-c processes by the same "B & R"-i.e., "base and resistor"-diffusion used to form the base regions of isolated vertical-structure transistors, and to form singly-diffused resistors and is then further formed or "pinched" by a subsequent "pinch" diffusion which is the same diffusion used to form the emitter regions of those vertical-structure transistors. Greater penetration of the subsequent diffusion into the earlier diffusion results in narrowing of transistor base width and attendant increase in transistor common emitter forward current gain ($h_{fe}$) and results in narrowing of resistor cross-section and attendant increase in its resistance. Lesser penetration, on the other hand, results in lessened transistor $h_{fe}$ and decreased resistor resistance.

Singly-diffused "B & R" resistors formed by the same diffusion process as used to form the base regions of isolated vertical-structure transistors are well known in monolithic integrated circuits. The resistances exhibited by singly-diffused B & R resistors and by doubly-diffused base pinch resistors exhibit a relatively weak temperature coefficient of +1.8 parts per thousand per Kelvin and a relatively strong temperature coefficient of +2.5 parts per thousand per Kelvin, respectively. This suggests their use together in voltage divider configurations for providing divisions of voltage which vary with temperature in a predictable way; such networks would be useful in a variety of temperature-compensated circuits. As a particular example, one might contemplate connecting two resistors, one of each type, in series to receive an input voltage, with a divided output voltage being obtained across one of them. One who attempts such usage runs into the problem that the resistances of the base pinch resistors depend on the penetration of the pinch diffusion into the B & R diffusion, while the resistances of the B & R resistors do not. The voltage division factor exhibited by a voltage divider thus tends to vary over the course of manufacture by more than one can tolerate in most temperature-compensated circuit designs.

The present invention addresses this problem by using a B & R resistor in a temperature-sensitive voltage divider together with not just a base pinch resistor alone, but in series combination with the base-emitter junction of a vertical-structure bipolar transistor arranged in common-collector-amplifier configuration. More particularly, the base pinch resistor is located in the base circuit of the transistor, and the B & R resistor is located in the emitter circuit of the transistor. The series combination of base pinch resistor, transistor base-emitter junction, and B & R resistor has a undirectional voltage applied to it of a polarity for forward biasing the base-emitter junction. The output connection of the divider is at one of the electrodes of the transistor other than its collector—at its emitter if the lower output impedance obtained from the impedance transforming properties of the common collector transistor are desired—and at its base if a voltage divider of relatively high resistance is desired, as for biasing the base of a common-emitter amplifier transistor, for example.

Figure 2:
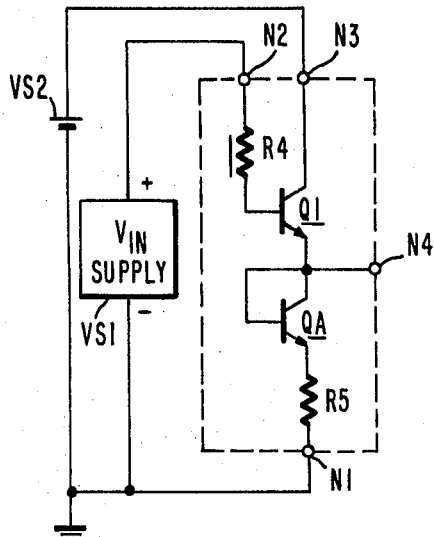
Figure 3:
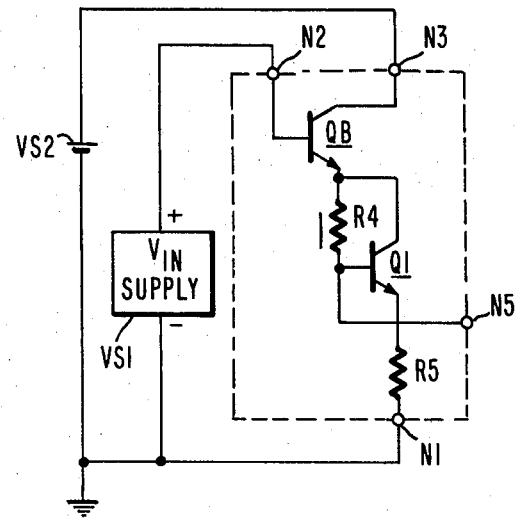
Figure 4:
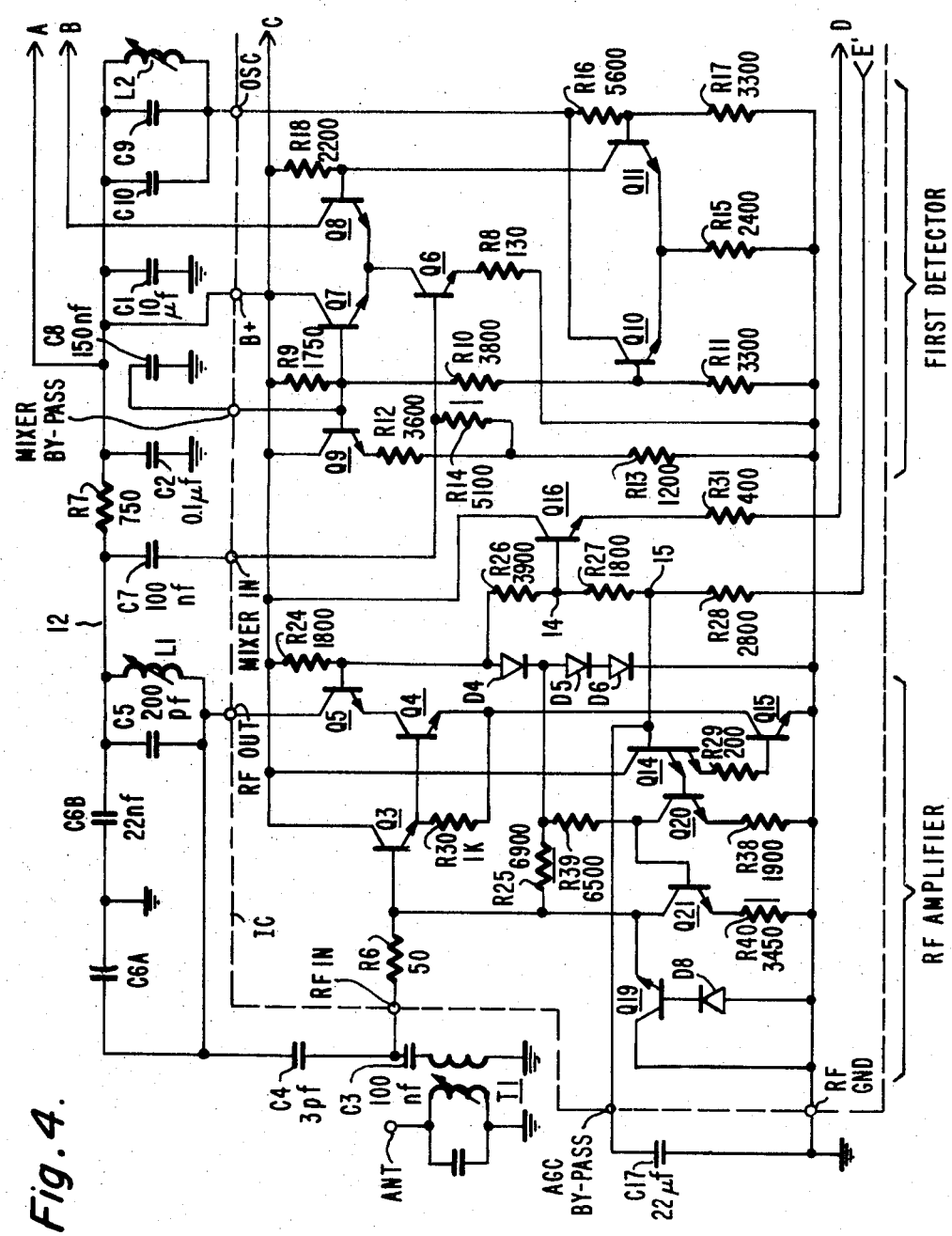
Figure 5:
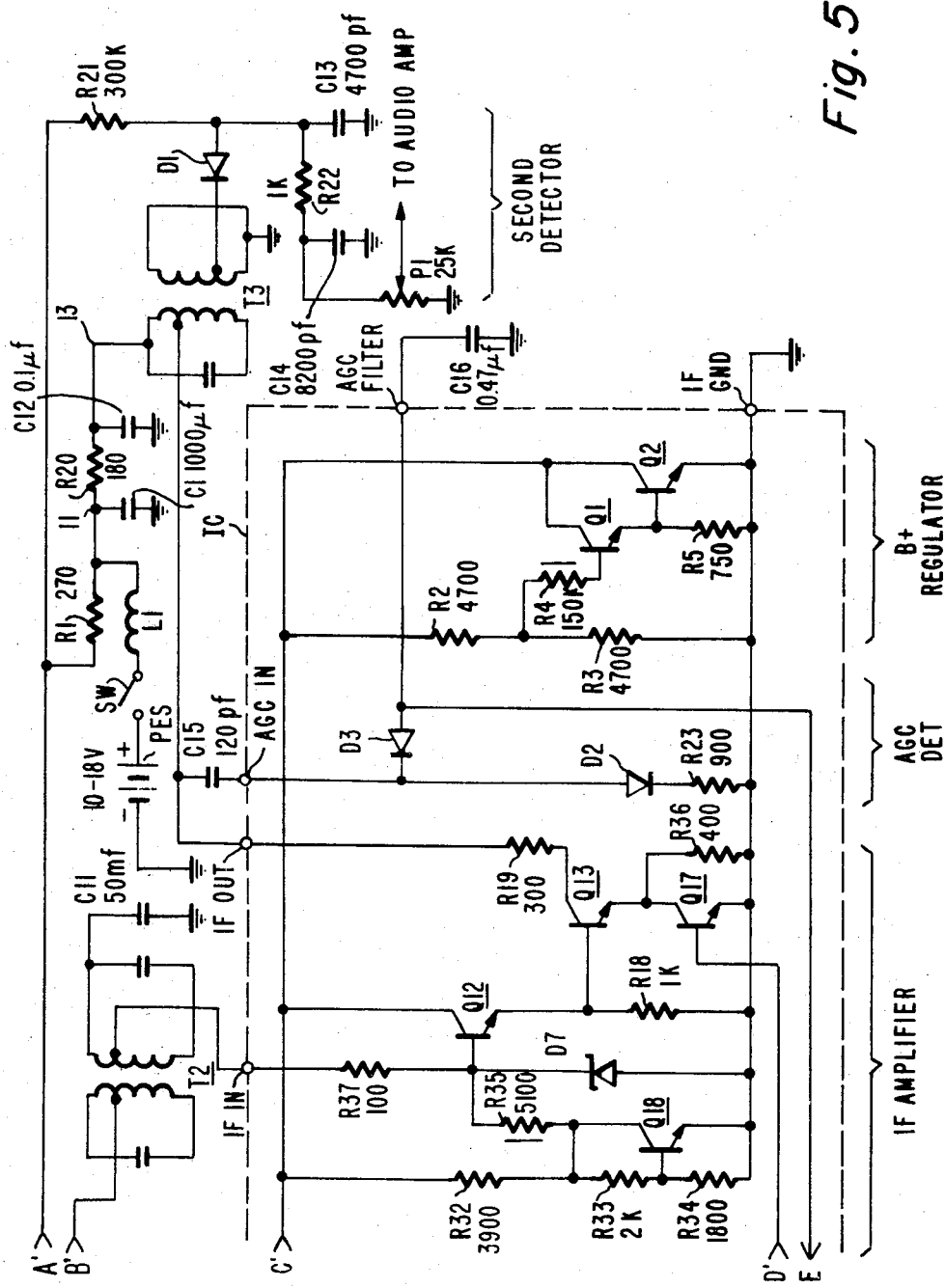

In the drawing:

Each of FIGS. 1, 2 and 3 is a schematic diagram of a voltage divider embodying the present invention; and FIGS. 4 and 5 are a schematic diagram of an AM radio receiver in which the biasing voltages for various stages are provided temperature-dependent voltage regulation for reducing the dependence of their cumulative gain upon temperature in accordance with further aspects of the present invention.

Figure 6:
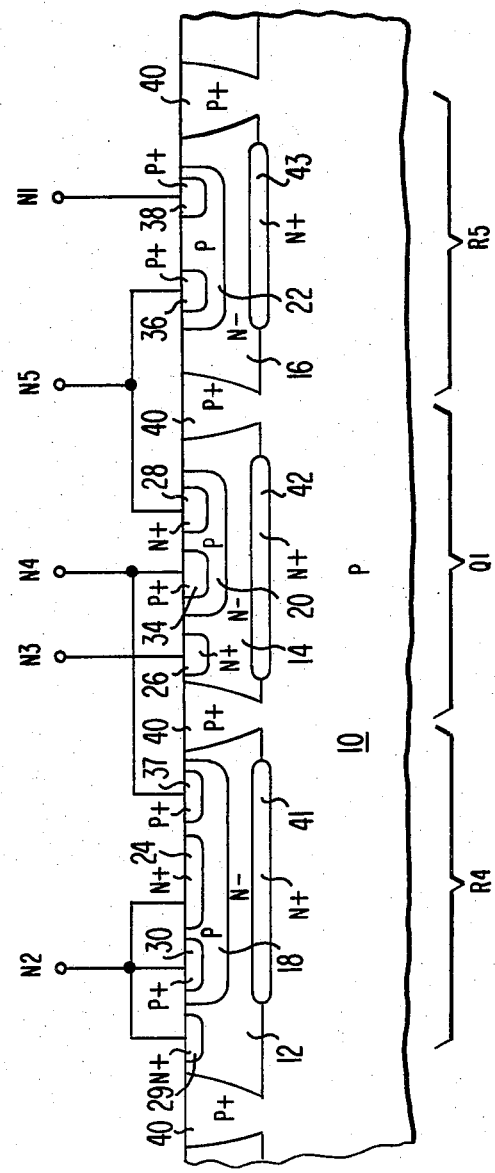

FIG. 6 is a cross-sectional view of a semiconductor substrate embodying the circuit of FIG. 1.

In FIG. 1 the components within the dashed box are constructed by conventional junction-isolated monolithic integrated-circuit construction or the like. Base-pinch resistor R4 is shown by the symbol comprising a barred conventional resistor symbol; Q1 is a vertical structure NPN bipolar transistor; and B & R resistor R5 is shown by the conventional resistor symbol. A supply VS1 of voltage to be divided is applied between nodes N1 and N2 of a series combination of R4, the base-emitter junction of Q1, and R5 in a poling such as to forward-bias the base-emitter junction. N1 is shown connected to a point of reference potential, ground, and a supply VS2 of direct voltage applies an operating voltage to the collector of Q1 via node N3. Divided voltages are available at nodes N4 and N5 to which the base and emitter electrodes of of Q1 respectively connect. R4 connects between nodes N2 and N4, and R5 connects between N5 and N1.

The resistance of $R_4$ of base pinch resistor R4 varies in proportion to the common-emitter forward current gain $h_{fe}$ of Q1, the resistance $R_5$ of B & R resistor R5 does not. The impedance-transformer action of Q1 connected as a common-collector-amplifier causes its base input impedance to equal ($h_{fe}+1$) times the quantity [$R_{EQ1}+R_5$], where $R_{EQ1}$ is the internal emitter resistance of Q1, substantially equal to the reciprocal of its transconductance and usually small compared to $R_5$. If $h_{fe}$ is many times—i.e. 30 to 200—larger than unity, as is the case in a well-designed vertical structure transistor, ($h_{fe}+1$) is substantially equal to $h_{fe}$. So $R_4$, which proportionally depends on $h_{fe}$, works against the base input impedance of Q1, which also proportionally depends on $h_{fe}$. Voltage division at node N4 is therefore little affected by change in $h_{fe}$, a principal variable encountered in manufacturing.

Considering voltage division at node N5, resistor R5 exhibits resistance $R_5$ that is essentially independent of $h_{fe}$. Looking back into the emitter of Q1, the resistance $R_4$ of resistor R4 proportionally depending upon $h_{fe}$ is divided by the ($h_{fe}+1$) impedance transformation of Q1's emitter-follower action and added to the relative small $R_{EQ1}$ to provide an effective emitter resistance exhibiting substantially no dependence on $h_{fe}$. So voltage division at node N4 is substantially independent of $h_{fe}$. Since the voltage at node N4 must follow that at N5 owing to emitter-follower action of Q1, the independence of voltage division from $h_{fe}$ variation at one of nodes N4 and N5 requires substantial independence at the other; and this requirement will be seen to be satisfied in the foregoing analysis.

FIG. 6 shows a semiconductor structure embodying the circuit of FIG. 1 fabricated on a substrate 10 made of P type silicon material. An epitaxial layer of N− type semiconductor material is grown on the surface of substrate 10, and formed into separate N− type boats 12, 14, and 16 by diffusing P+ isolation regions 40. Beneath each N− boat is a respective buried N+ pocket 41, 42 and 43 which serves to reduce parasitic PNP transistor action and increase the conductivity across the lower region of the respective N− boat.

Disposed within each N− boat 12, 14 and 16 is a respective p region 18, 20, and 22, each forming a respective PN junction therewith. P+ regions 30 and 37, region 34, and regions 36 and 38 are formed within respective P regions 18, 20, and 22 for the purpose of making respective contact thereto. Similarly, N+ regions 29 and 26 are formed within N− boats 12 and 14 for one purpose of making respective contact thereto.

Pinch resistor R4 is formed within the P region 18 by diffusion of the N+ region 24. In the same processing step, the emitter of transistor Q1 is formed by diffusing N+ region 28 into P region 20. One end of resistor R4 at P+ region 30 is connected to node N2 which is also connected to N+ regions 29 and 24 which biases the latter regions to a relatively positive potential with respect to P region 18 so that respective PN junctions formed with resistor R4 (i.e., P region 18) are reversed biased. The other end of resistor R4 at P+ region 37 is connected to the base of transistor Q1 (P+ region 34) and to node N4.

The collector of transistor Q1 (N− boat 14) is connected to node N3 through ohmic contact with N+ region 26. The emitter of transistor Q1 (N+ region 28) is connected to node N5 and to one end of resistor R5 at P+ type region 36. The other end of resistor R5 at P+ type region 18 connects to circuit node N1. The N− boat 16 is biased to a relatively positive potential (not shown) with respect to P region 22 so that the PN junction formed with resistor R5 (i.e. P region 22) is reversed biased.

In the simple voltage divider of FIG. 1 the −1.75 mV per Kelvin change in the emitter-to-base offset voltage $V_{BEQ1}$ of Q1 must, of course, be taken into account in the calculation of the temperature dependency of voltage division at nodes N4 and N5. Voltage at node N4, as referred to ground, tends to exhibit decrease with temperature owing to the relatively strong positive temperature coefficient of R4 and to the negative temperature coefficient of $V_{BEQ1}$ and relative weak positive temperature coefficient of R5. The voltage at node N5 can be made to exhibit zero, positive or negative temperature coefficient depending upon the ratio of R4 and R5.

The effects of $V_{BEQ1}$ upon voltage division in voltage dividers of the general type shown in FIG. 1 can be compensated against. FIGS. 2 and 3 are illustrative of how such compensation can be afforded at nodes N4 and N5, respectively.

FIG. 2 shows compensation against the effects of $V_{BEQ1}$ variation, as they appear as node N4, for the specific case where R4 is chosen to equal $(h_{fe}+1)R_5$ at same base temperature $T_o$. The effect of $V_{BEQ1}$ on the portion of the voltage divider above node N4 is compensated for by the effect of the emitter-to-base offset voltage $V_{BEQA}$ of diode-connected NPN transistor QA on the portion of the voltage divider below N4. No matter whether the series connection of R5 and diode-connected transistor QA is in the order shown, or in the reverse order, similar emitter current flows through Q1 and QA having similar diffusion profiles and similar emitter-base junction areas will result in $V_{BEQ1}$ and $V_{BEQA}$ being equal. This example of compensation against the effects of $V_{BEQ1}$ variation on voltage at node N4 provides insight into how to compensate against these effects for other voltage division factors. If R5 be larger than R4 by a factor m exceeding unity, QA can be replaced by a multiple-$V_{BE}$ supply providing an offset of m $V_{BEQ1}$—e.g., m diode-connected transistors in series connection if m be integral. If R4 be larger than R5 by a factor $\overline{m}$ exceeding unity, the FIG. 2 voltage divider is modified by insertion of a multiple-$V_{BE}$ supply providing an offset of $(\overline{m}-1)V_{BEQ1}$ between the emitter of Q1 and node N4.

FIG. 3 shows compensation against the effects of $V_{BEQ1}$ variation, as they appear at node N5, for the specific case where R4 is chosen to equal $(h_{fe}+1)R_5$ at some base temperature $T_o$ to place the value of the voltage at node N5 midway between the voltages at nodes N1 and N3 for operation at $T_o$. The effect of $V_{BEQ1}$ on the portion of the voltage divider below node N4 is compensated for by the effect of the emitter-to-base offset voltage of emitter-follower transistor QB interposed between node N2 and resistor R4. The collector current of Q1, as well as its base current flowing through R4 is withdrawn from the emitter of QB, so the emitter currents of Q1 and QB are the same magnitude, presuming N5 to be negligibly loaded by ensuing circuitry. This example of compensation against the effects of $V_{BEQ1}$ variation on voltage at node N5 provides insight into how to compensate against these effects for other voltage division factors. If R5 be larger than R4 by a factor m exceeding unity, the FIG. 3 voltage divider is modified by insertion of a multiple $V_{BE}$ supply providing an offset of $(m-1)V_{BEQ1}$ in series with R5 wherein node N1 and the emitter of Q1. If R4 be larger than R5 by a factor $\overline{m}$ exceeding unity, the FIG. 3 voltage divider is modified by the insertion of a multiple-$V_{BE}$ supply providing an offset of $(\overline{m}-1)V_{BEQ}$ between resistor R4 and the emitter of QB.

In the FIG. 2 and 3 voltage dividers, where multiple-$V_{BE}$ supplies supplying less than $V_{BEQ1}$ would be required in the upper or lower portion of the voltage divider, it may be convenient to insert a diode-connected transistor in the other portion of the divider and increase the voltage supplied by the multiple-$V_{BE}$ supply by $V_{BEQ1}$. Where loading of the input voltage supply VS1 is not of concern, the FIG. 1, 2 and 3 voltage dividers may be modified by connecting node N3 to node N2 and dispensing with voltage supply VS2.

In FIGS. 4 and 5 the apparatus enclosed within the dotted lines IC is constructed within the confines of a monolithic integrated circuit. This apparatus when combined with discrete components shown outside the dotted lines IC provides the r-f amplifier, first detector, i-f amplifier, and second detector portions of an AM radio receiver. Since all transistors in the integrated apparatus are of NPN conductivity type, the cheapest conventional integrated circuit construction using junction-isolated vertical structure transistors disposed on a common substrate can be used. The semiconductor material used in the integrated circuit will conventionally be silicon. The smallest transistors on the circuit typically would exhibit an emitter-to-base offset potential (or $V_{BE}$) of 725 mV for 1 mA of collector current to flow and have a d-c common-emitter forward current gain or $h_{fe}$ of about 100. Connections A, B, C, D on the FIG. 4 portion of the AM receiver circuit are made to connections A', B', C', D' on the FIG. 5 portion, and connection E on the FIG. 5 portion is made to connection E' on the FIG. 4 portion. The primary energizing supply PES for the receiver is shown in FIG. 5 to be a battery supplying 10 to 18 volts, as may be encountered in an automobile having a nominally +12 volt electrical system; and conventional accommodations may be made to a −12 volt electrical system. The i-f amplifier AGC detector and B+ regulator portions of the integrated circuit IC, shown in FIG. 5, operate from a ground bus connected via terminal IF GND to a ground return to the supply PES. The substrate of the integrated circuit is provided with an ohmic contact connected to the IF GND terminal. The r-f amplifier and first detector portions of integrated circuit IC, shown in FIG. 4 oprate from a separate ground bus connected via terminal RF GND to a ground return to the supply PES.

In FIG. 5 a switch SW selectively connects the positive pole of supply PES to the input of a supply filter comprising series arm inductor L1 and shunt leg capacitor C1. The output of this filter at node 11 supplies unregulated d-c to the audio amplifier portions of the radio receiver, not shown in the drawing, as well as to the earlier stages of the radio receiver shown in the drawing. A resistor R1 connects node 11 to the terminal B+ of the integrated circuit IC shown in FIG. 4 (this connection being via inter-connection A-A'). Terminal B+ connects to positive operating voltage busses used by the r-f amplifier and first detector of the FIG. 4 portion of the receiver, which latter bus also connects (via interconnection B-B') to the i-f amplifier and B+ regulator of the FIGURE portion of the receiver.

The B+ regulator includes means for dividing the voltage appearing between the IF GND and B+ terminals, shown as a resistive voltage divider comprising resistors R2 and R3 serially connected between those terminals. The interconnection of R2 and R3 is connected via a doubly diffused or "pinch" resistor R4 of relatively high resistance to the base of NPN transistor Q1. Q1 is followed in Darlington cascade connection by another NPN transistor Q2. This Darlington cascade works in conjunction with R1 to provide for shunt regulation of the voltage appearing between the IF GND and B+ terminals. In doing this, the emitter-to-base voltage of Q2 is regulated to a value varying only 60 mV. or so around a nominal value near 700 mV. A resistor R5 connects the base and emitter of Q2; and the current flow therethrough attributable to the 700 millivolts or so there-across is made five times or so as large as the maximum base current of Q2, in order that the emitter current of Q1 is substantially constant. Now, the resistance of a pinch resistor, such as R4, varies in accordance with the common-emitter forward current gain $h_{fe}$ of a vertical-structure NPN transistor, such as Q1, in a monolithic i-c structure. So voltage regulation is substantially insensitive to process variation that affects $h_{fe}$.

The voltage $V_{B+}$ at the B+ terminal will be regulated to a value larger than the sum of the voltage drop $V_{R4}$ across resistor R4 and the emitter-to-base offset potentials (or $V_{BE}$'s) of Q1 and Q2, by a factor equal to the ratio by which B+ is divided in the resistive potential divider comprising resistors R2 and R3 with respective resistances R2 and R3. This can be expressed in equation form as follows.

$$V_{B+} = [(R_2+R_3)/R_3][V_{R4}+2V_{BE}]$$

As is well known, $V_{BE}$ decreases with increasing temperature.

However, it is desirable in an AM radio such as that shown in the drawing, wherein the amplifier stages are biased from multiple−$V_{BE}$ bias voltages with the currents used to develop the $V_{BE}$ drops being determined in rough proportion to $V_{B+}$ *divided by resistance, that* $V_{B+}$ increase with temperature. This is desirable in order to avoid the decrease in the $g_m$'s of the amplifier transistors as their emitter-to-base voltages, or $V_{BE}$'s, are reduced. This reduction of stage gains would be multiplicative in its effect and would seriously reduce the sensivity of the AM radio receiver at higher operating temperatures. Accordingly, $V_{R4}$ should be made to increase with temperature more than the $2V_{BE}$ term decreases with temperature.

Since the ratio of the resistance $R_4$ of R4 to the common-emitter forward current gain $h_{feQ1}$ of Q1 is constant for reasons previously set forth, $V_{R4}$ will be in predictable ratio to the emitter current $I_{EQ1}$ of Q1, as set forth in the following expression.

$$V_{R4} = (R_4/h_{fe})I_{EQ1}$$

The emitter current $I_{EQ1}$ of Q1 has the value $V_{BE}/R_5$ as noted above, leading to the following expression.

$$V_{R4} = (R_4/h_{fe})(V_{BE}/R_5)$$

The strong positive temperature coefficient +2.5 parts per thousand per degree Kelvin of the R4 pinch resistance lets $V_{R4}$ exhibit the desired positive coefficient of temperature, even though $V_{BE}$ has a negative temperature coefficient of −1.75 mV per degree Kelvin and resistor R5 has a positive temperature coefficient of 1.8 parts per thousand per degree Kelvin.

But further, the operating temperature of the integrated circuit IC—or of any integrated circuit including shunt regulating devices—tends to increase with increased value of unregulated voltage supplied for regulation. This is because the shunt regulating devices pass more current with relatively little change in voltage under such conditions. The passage of more current necessarily requires greater $V_{BE}$ of Q2, increasing the current $I_{EQ1} = V_{BEQ2}/R_5$ and thus the $V_{R4}$ as well as the $2V_{BE}$ terms determining $V_{B+}$. This leads to $V_{B+}$ increasing with increase in the voltage $V_{PES}$ supplied by supply PES, when the voltage regulator shown in FIG. 2 is used. This is shown in the following table, which also shows that the sensitivity of the AM receiver for one watt output does not decrease appreciably with increased $V_{PES}$ over the range of $V_{PES}$ one expects normally to find in an automobile. The r-f input signal voltage $v_{RF-IN}$ is measured at the output of an r-f signal generator connected to drive the antenna terminal ANT at left of FIG. 1 through a 39 pF. equivalent antenna capacitance.

| $V_{PES}(v)$ | $V_{B+}(v)$ | $V_{RF-IN}(mV)$ |
| --- | --- | --- |
| 9 | 5.74 | 4.6 |
| 10 | 6.01 | 3.4 |
| 11 | 6.54 | 2.8 |
| 12 | 7.04 | 2.5 |

| $V_{PES}{}^{(v)}$ | $V_{B+}{}^{(v)}$ | $V_{RF-IN}{}^{(mV)}$ |
|---|---|---|
| 13 | 7.40 | 2.3 |
| 14 | 7.65 | 2.25 |
| 15 | 7.84 | 2.20 |
| 16 | 8.00 | 2.10 |
| 17 | 8.14 | 2.05 |
| 18 | 8.28 | 2.0 |

Capacitor C1 in the upper right corner of FIG. 4 provides the dominating roll-off in frequency response for the feedback loop conditioning the Darlington cascade connection of Q1 and Q2 to provide shunt regulation. C1 is parallelled by an r-f by-pass capacitor C2 disposed as to provide high-frequency decoupling between the r-f amplifier and the later stages of the receiver.

The passage of signals through the AM receiver will now be generally described, beginning at the antenna terminal ANT. A singly tuned r-f transformer (or antenna coil) T1 is arranged to couple radio signals received at antenna terminal ANT to the radio receiver; the output winding of T1 being connected via a d-c blocking capacitor C3 to a terminal RF IN of the integrated circuit IC and thence through a feedforward capacitor C4 to a terminal RF OUT of the integrated circuit IC. RF IN is the r-f input signal terminal for the r-f amplifier stage of the receiver being connected via a resistor R6 and by the emitter-follower, or common-collector-amplifier, action of an NPN transistor Q3 to the base of a NPN common-emitter-amplifier transistor Q4. Q4, which has reverse AGC applied together with emitter degeneration to its emitter has its collector connected to the terminal RF OUT by the common-base amplifier action of another NPN transistor Q5. Q4 and Q5 thus form a gaincontrolled cascode amplifier working into a tank circuit including inductor L1 by a capacitor C5 resonating it in the range of the image frequency and parallelled by the series connection of capacitors C6A and C6B. C6A is the principal capacitance against which L1 tunes, and its capacitive transformer action with C6B provides transformed r-f signal at lower source-impedance-level to be applied through d-c blocking capacitor C7 to the MIXER IN terminal of IC. L1 is gang-tuned together with the primary winding of antenna coil T1 and inductor L2 in the local-oscillator tank circuit. Direct current for the collector of Q5 is supplied via resistor R7 from terminal B+ to a node 12 to be conducted by inductor L7 to the RF OUT terminal.

The amplified and transformed r-f signal applied to the mixer input terminal MIXER IN via C7 is in turn applied to the base of NPN transistor Q6 to modulate its conduction. To permit Q6 to handle larger input signals linearly, it is provided with an emitter degeneration resistor R8 for providing linearization by current feedback. Q6 provides a source of modulated tail current to the emitter-to-emitter connection of long-tailed-pair NPN transistors Q7 and Q8. The base electrodes of Q7 and another NPN transistor Q9 connect at a terminal MIXER BY-PASS for r-f by-passing to ground via capacitor C8.

The base electrodes of Q7 and Q9 also receive a direct bias potential from the interconnection of resistors R9 and R10. R9, R10 and a resistor R11 are connected serially in order of naming between the B+ and RF GND terminals. Q9 has a further resistive voltage divider in its emitter circuit. This divider includes resistors R12 and R13 connected serially in order of naming from the emitter of Q9 to RF GND, and a resistor R14 biases the base electrode of Q6 from the interconnection of R12 and R13. R14 is preferably a pinch resistor, as shown, so any variation of the $h_{fe}$ of Q6 during the course of manufacturing is compensated by the attendant variation in the resistance of R14 and thus the potential drop across R4. Q6 will operate at more constant collector current and thus at more constant $g_m$. The emitter-follower action of Q9 decouples the base of Q7 from amplified r-f signal appearing at MIXER IN and conducted by R14 and R12; and the negative temperature coefficient of its $V_{BE}$ causes slightly more positive base potential to be applied to Q6 with increased temperature to overcome the tendency for its $g_m$ to reduce with increased temperature. The divided voltage appearing at the interconnection of R10 and R11 is applied to the base of NPN transistor Q10 as its base potential $V_{BQ10}$.

The collector electrode of Q10 connects via a terminal OSC to the local-oscillator tank circuit comprising parallelled capacitors C9 and C10 in addition to inductor L12, which tunes with them and completes the path for direct current from B+ terminal to OSC terminal and the collector of Q10. The emitter of Q10 connects to RF GND through resistor R15 and limits the emitter current $I_{EQ10}$ of Q10 when NPN transistor Q11, connected emitter-to-emitter with Q10, is non-conductive. Q11 will be non-conductive and Q10, conductive when the base potential $V_{BQ11}$ of Q11 is appreciably less positive than $V_{BQ10}$; and Q11 will be conductive and Q10, non-conductive when $V_{BQ11}$ is appreciably more positive than $V_{BQ10}$. $V_{BQ11}$ is derived by potential division from the OSC terminal on the local-oscillator tank circuit, completing a regenerative feedback loop through the long-tailed-pair amplifier connection of Q11 and Q10 that sustains oscillations in the local oscillator tank. Resistors R15 and R16 connected serially in order of naming between the OSC and RF GND terminals form a resistive potential divider for this purpose, the interconnection between them providing $V_{BQ11}$. $V_{BQ11}$ varies sinusoidally at local-oscillator frequency to gate Q10 and Q11 into conduction on alternative half cycles of local-oscillator frequency. The potential divider comprising R16 and R17 is proportioned vis-a-vis the voltage divider comprising R9, R10, and R11 so the quiescent values of $V_{BQ10}$ and $V_{BQ11}$ are at the same design center voltages, with R9 being reduced in resistance to allow for the combined base currents of Q7 and Q9 increasing the potential drop thereacross. The resistance of R15 is chosen low enough respective to the resistance of the series connection of R16 and R17 so that the regenerative loop including Q10 has sufficient gain to maintain oscillations in the local oscillator tank circuit.

The collector current of Q11 flows through a resistor R18, connecting the base electrode of Q8 to the B+ terminal, and switches Q8 out of conduction during the alternate half cycles of local oscillator frequency during which Q11 is switched into conduction. More particularly, Q8 is switched out of conduction by its base potential $V_{BQ8}$ being pulled down to a value substantially less positive than the base potential $V_{BQ7}$ of Q7, which is in emitter-to-emitter connection with Q8. During the alternate half cycles of local oscillator frequency when Q11 is switched out of conduction, so there is no potential drop across R18, $V_{BQ8}$ rises to $V_{B+}$ potential. This switches Q8 into conduction to divert all of the collector current of Q6 to flow as emitter current to Q8, thus switching Q7 out of conduction. So, the collector current of Q8 available at the MIXER OUT terminal of the integrated circuit IC is a heterodyne signal provided by the collector current of Q6, linearly modulated in accordance with amplified r-f signal, being chopped at local-oscillation rate. This provides extremely linear mixer action.

The heterodyne signal current flowing through the MIXER OUT terminal flows through interconnection B-B' to be coupled by the double-tuned first i-f transformer T2 to the i-f input signal terminal IF IN of the integrated i-f amplifier. Transformer T2 and the i-f amplifier stage now to be described appear in FIG. 5. The selectivity afforded by transformer coupling through T2 filters against r-f, the local oscillator frequency, and unwanted components of their heterodyning in favor of the intermediate frequency of choice. A capacitor C11 provides i-f ground to one end of the secondary winding of T2. The i-f signal at IF IN is applied via resistor R37 to the base of an NPN common-collector-amplifier transistor Q12, the emitter of which connects to the base electrode of an ensuing NPN common-emitter-amplifier transistor Q13. Q13 is reverse AGC'd with controlled degeneration at its emitter. Resistor R18, connecting the emitter of Q12 to ground, provides for substantially constant collector-to-emitter current flow for Q12, despite the change in the base current of Q13 as its gain is controlled by its reverse AGC. The collector of Q13 connects via resistor R19 to the i-f output signal terminal IF OUT of the integrated i-f amplifier and thence via the tapped primary winding of the second i-f transformer T3 to a node 13. Node 13 receives unregulated positive operating potential from node 11 via resistor R20. Capacitor C12 by-passes node 13 to ground for i-f and cooperates with R20 and C1 to form a low-pass pi-section filter that reduces unwanted coupling of amplified i-f back to the r-f amplifier and first detector stages.

The second i-f transformer T3, like the first i-f transformer T2, is double-tuned for better selectivity. Its secondary winding, grounded for r-f at one end thereof, is tapped for connection to the rectifying element of the second detector circuit. This rectifying element is a semiconductor diode D1 connected at its cathode to the tapped secondary winding and biased just into slight forward conduction by current flowing to its anode from the B+ terminal through a resistor R21 of relatively high resistance. Capacitor C13 connected between the anode of D1 and ground is the i-f filtering element of the second detector, and the audio-frequency component of the amplified and subsequently rectified i-f output signal appears across C13. In automobiles, which use slug-tuned inductors for selecting frequencies to be received, the intermediate frequency is commonly 262 kHz rather than 455 kHz, to ease tracking of the tuning inductors and to avoid the need for Litz wire in the i-f transformers. A low-pass L-section filter comprising series arm resistor R22 and shunt leg capacitor C14 is a "tweet" filter for suppressing harmonics of the i-f frequency which fall within the band of frequencies received by the AM radio. Potentiometer P1 connected across C14 is the volume control potentiometer which precedes an ensuing audio amplifier, not shown.

The amplified i-f signal appearing at the IF OUT terminal is applied via d-c blocking capacitor C15 to the input terminal AGC IN of the integrated AGC detector. This detector is in essence a Cockcroft voltage-doubler, although capacitor C16 at the output, AGC FILTER terminal of the circuit is many, many times larger than C15 at its input terminal AGC IN. It includes semiconductor diode D2 and resistor R23 in series connection between terminals AGC IN and IF GND in such poling as to conduct on the positive peaks of amplified i-f signal, thereby discharging C15 to shift the average-value axis of the amplified i-f signal at the AGC IN terminal to a less positive voltage than appears under no-signal conditions. The AGC detector further includes a semiconductor diode D3 connected between the AGC IN terminal and an AGC FILTER terminal, which latter terminal is by-passed to ground for low frequencies by an AGC filter capacitor C16. D3 is so poled that C16 re-charges C15 on negative peaks of the amplified and shifted i-f signal at the AGC IN terminal.

Referring back to FIG. 4 portion of the integrated circuit IC, consider the string of serially connected semiconductor diodes D4, D5 and D6. Resistor R24 connects between B+ and the anode of D4 to provide a path for forward bias current to D4, to D5 connected at its anode to the cathode of D4, and to D6 connected at its anode to the cathode of D5 and at its cathode to RF GND. A "2 $V_{BE}$" voltage substantially twice the 700 mV or so offset potential across a semiconductor diode will appear at the interconnection of D4 and D5, and a "3 $V_{BE}$" voltage, substantially three times the 700 mV. or so will appear at the anode of D4. Diodes D2, D3, D4, D5 and D6 will in conventional integrated circuit constructions be formed from vertical-structure NPN transistors with emitter serving as cathode and with interconnected base and collector serving as anode; it is owing to this practice that expressions "2 $V_{BE}$" and "3 $V_{BE}$" are used in describing offset potentials across series connections of these diodes. The +3 $V_{BE}$ voltage at the anode of D4 is applied directly to the base of Q5. The +2 $V_{BE}$ voltage at the interconnection of D4 and D5 is applied via resistor R25 to the base of Q3, tending to bias the serially connected base-emitter junctions Q3 and Q4 for conduction. Their base-to-emitter offset potentials reduce the +2 $V_{BE}$ voltage to place so low a collector potential on Q15 it must operate in saturation. R25 is made a pinch resistor to counteract the tendency towards the reduction of the $g_m$'s of Q3 and Q4 as IC temperature rises.

The +3 $V_{BE}$ voltage is also the voltage against which the AGC detector works. A resistive potential divider comprising resistors R26, R27 and R28 connected serially in order of their naming between +$V_{BE}$ and the AGC FILTER terminal provides, firstly, a potential $V_{14}$ at node 14 between R26 and R27, which potential is used in controlling the i-f amplifier gain, and, secondly, a potential $V_{15}$ at node 15 between R27 and R28, which potential is used in controlling the r-f amplifier gain. Node 15 is by-passed to ground via the AGC BY-PASS TERMINAL connected by capacitor C17 to ground.

Current flows through the serially connected resistors R26, R27 and R29 and interconnection D-D' to forward-bias the diodes D3 and D2 in the AGC detector of FIG. 2. By reason of the potential divider action between—on the one hand—resistors R26, R27 and R28 of FIG. 1—on the other hand—diode D3 and D2 and resistor R23 of FIG. 2, the AGC FILTER terminal will be biased to a voltage somewhat larger than +2 $V_{BE}$ under no signal conditions. The voltage at the AGC FILTER terminal varies from +1.68 volts under no-signal conditions downward to +1.20 volts under very strong r-f input signal conditions. The potential divider action of R26 and R27 delays AGC to the i-f amplifier, maintaining Q17 in saturation over a greater portion of this voltage range than Q13 is maintained in saturation.

Node 15 is by-passed by a capacitor 17 connected between r-f ground and a terminal AGC BY-PASS of integrated circuit IC. C17 determines the AGC time constant together with the resistance of the series connection of R26, R27 and R28. C17 cooperates with R28 to provide further filtering of the AGC lines against residual amplified i-f on the AGC FILTER terminal. C17 cooperates with R27 and Q16 to decouple i-f coming back through the i-f AGC connections from being applied to the base of NPN transistor Q14 in the r-f AGC connections.

The voltage $V_{15}$ at node 15 between R27 and R28 is applied to the base of NPN common-collector transistor Q14, which has a first emitter connected via a resistor 29 to the base of a grounded-emitter NPN transistor Q15. The collector of Q15 connects to the emitter of the common-emitter r-f amplifier transistor Q4 for applying reverse AGC. Q15 operates in saturation, responding substantially linearly to applied base current to provide controlled conductance between its collector and emitter. The area of its base-emitter junction is 18 times that of the smallest transistor permitted by chip design rules. The ratio between the respective areas of Q15, Q4, and Q3 is 18:10:1.5. There is no need for an r-f by-pass capacitor between the emitter of Q4 and RF GND, saving a terminal on the integrated circuit IC. Q15 has the low emitter-to-collector potential needed to operate it in saturation assured, owing to the base electrode of Q3 having a $+2 V_{BE}$ quiescent potential applied to it via R25. The emitter-follower action of common-collector r-f amplifier transistor Q3 places its emitter at a $+1 V_{BE}$ potential, the effect of $h_{fe}$ variation in Q4 upon the emitter current of Q3 being minimized by parallelling the emitter-base junction of Q4 with a resistor R30 of relatively low resistance. The emitter follower action of Q4 then tends to place its emitter at a voltage near ground to guarantee the operation of Q15 in saturation. R29 buffers the emitter of Q14 from the low base impedance preferred by the saturated transistor Q15, so the potential at node 15 can maintain control of the base voltage $V_{BQ14}$ and so node 15 is not clamped in potential to attenuate gain control voltage variations at node 14 between resistors R26 and R27.

The voltage $V_{14}$ at node 14 between R26 and R27 is applied to the base of a common-collector NPN transistor Q16. The emitter of Q16 is connected via a buffering resistor R31 to the base of a grounded-emitter NPN transistor Q17, operated in saturation at low r-f input signal levels for applying reverse AGC to common-emitter i-f amplifier transistor Q13. That is, the scheme of gain control for the common-emitter i-f amplifier transistor Q13 is similar to the scheme of gain control for the common-emitter r-f amplifier transistor Q4. The base-emitter junction of Q17 has an area similar to that of Q15. The respective areas of the base-emitter junctions of Q17, Q13, and Q12 are in 18:4:1.5, ratio, Q12 being smaller. The biasing of the base of Q13, so that Q17 may operate in saturation at low r-f input signal levels, is carried out as follows.

Grounded-emitter NPN transistor Q18 has its collector connected to B+ via a collector load resistor R32. Q18 is provided with direct-coupled collector-to-base feedback by the potential divider action of resistors R33 and R34 having respective resistances $R_{33}$ and $R_{34}$. This feedback tends to increase the conduction of Q18 to the point where the voltage drop across R32 reduces the emitter-to-collector voltage $V_{CEQ18}$ of Q18 to $[(R_{33}+R_{34})/R_{34}]$ times $V_{BE}$, the emitter-to-base voltage of Q18 having a nominal value $V_{BE}$ over a range of current owing to the logarithmic relationship of that voltage in a transistor to its level of conduction. $R_{33}$ and $R_{34}$ are so proportioned that $V_{CEQ18}$, applied via resistor R35 to the base electrode of Q12, is slightly in excess of $+2 V_{BE}$. R35 is made a pinch resistor to counteract the tendency towards reduction of the $g_m$'s of Q12 and Q13 as IC temperature rises. The emitter-follower action of Q12 responds to this quiescent base potential with a quiescent emitter potential slightly in excess of 1 $V_{BE}$, applied as quiescent base potential to Q13. The emitter-follower action of Q13 then applies a sufficiently low collector potential to Q17 to operate it in saturation at all but the lowest current levels, encountered under very strong r-f input signal conditions. Resistor R36 connects the emitter electrode of Q13 to IF ground, providing the principal path for conducting the emitter current of Q13 under these very strong r-f input signal conditions.

Consider no-signal conditions, when the voltage $V_{15}$ at node 15 and the AGC BY-PASS terminal is $+1.68$ V. $V_{14}$ at node 14 will be about midway between that voltage and $+3V_{BE}$—i.e. 1.85 V.—forward biasing and serially connected base-emitter junctions of Q16 and Q17 annd conditioning Q17 for maximum conduction. Q17 accordingly operates in saturation, providing a high conductance path from the emitter of common-emitter i-f amplifier transistor Q13 to IF GND, which additionally tends to make the emitter potential $V_{EQB}$ of Q13 less positive, increasing the forward-bias upon its base-emitter junction and thereby conditioning Q13 to exhibit high transconductance. A $V_{15}$ of $+1.68$ V conditions Q14 and Q15 for maximum conduction, increasing the conductance of Q15 between the emitter of common-emitter r-f amplifier transistor Q4 and ground, and thereby conditioning Q4 to exhibit high transconductance. Both the r-f and i-f amplifiers exhibit their maximum gains and will have their gains reduced but little for weak r-f input signal conditions.

Under less weak r-f and normal input signal conditions—e.g., from 0.1 to 10 mV.—the voltage at the AGC FILTER terminal in response to higher amplified i-f signal will decrease, so that $V_{14}$ is reduced sufficiently to cut back conduction in Q14 and Q15 and subsequently in Q4. This reduces the r-f amplifier gain to reduce overall receiver gain, it being desirable to reduce r-f amplifier gain before i-f amplifier gain to reduce the noise generated in the earlier stage as r-f input signal strengthens. At the same time the increased emitter regeneration of Q4 increases the capability of the r-f amplifier to amplify larger i-f input signals without distorting them.

Under stronger r-f input signal conditions—e.g., above 5 mV.—the continuing decrease in the voltage at the AGC FILTER terminal responsive to still higher amplified i-f signal, will result in $V_{15}$ being reduced sufficiently to cut back conduction in Q16 and Q17. The decreased conductance presented by Q17 between IF GND and the emitter electrode of Q13 will reduce the transconductance of Q13, both in effect and in actuality, reducing i-f amplifier gain together with continued reduction in r-f amplifier gain.

At still stronger r-f signal levels—e.g., above 50 mV.—the gain of the r-f amplifier will be very much reduced, so the r-f signal fed forward from the RF IN terminal to the RF OUT terminal via feed-forward capacitor C4 will be larger than the "amplified" r-f signal supplied from the output of the gain controlled r-f amplifier. Continued receiver gain reduction will then for all practical effect take place in the gain-controlled i-f amplifier. The use of the feed forward capacitor around the r-f amplifier avoids the flat AGC characteristic that is disfavored because of the difficulties it causes in tuning an AM channel accurately without a visual tuning indicator; rather the output of the radio receiver increases gently with increasing r-f input sigal so one can tune according to the loudness of the radio.

Avalanche conduction by the base-emitter junctions of the r-f amplifier transistors Q3 and Q4 shown in FIG. 4, while the collector-substrate junction of Q15 conducts in the forward direction, would be deleterious to Q3 and Q4. Electrostatic charges applied between the RF GND and RF IN terminals during handling of the integrated circuit IC prior to its connection to the other portions of the radio or during lightning storms after connection in the radio present the danger of such avalanche conduction. Such avalanche conduction is precluded by the clamping action of a "Darlington diode" configuration of diode D8 and NPN transistor Q19 connected at its anode to RF GND and its cathode to the base electrode of Q3, preventing the base of Q3 going more than 2 $V_{BE}$ more negative than the potential at RF GND.

Avalanche conditions over the collector-substrate junction of Q21 cannot afford protection against electrostatic potentials between RF GND and RF IN terminals since the substrate of the integrated circuit IC is connected to IF GND to avoid "tweet" problems. Resistor R1 limits the current flow through the Darlington diode on noise peaks caused by r-f static and during input signal overload conditions. Common-collector r-f amplifier transistor Q1 precedes common-emitter r-f amplifier transistor Q2 so that no loss of signal occurs by potential divider action between R1 and the base circuit of Q2.

R19 limits the amplitude of current flow through the collector-substrate junction of Q13 should negative voltage accidentally be imposed between the IF GND and IF OUT terminals. D7 prevents the avalanche conduction of the base-emitter junctions of Q12 and Q13 owing to electrostatic potentials being applied between IF GND and IF IN terminals during the handling of IC between manufacture and installation in a radio. R37 limits the amplitude of current flow through D7 should negative voltage accidentally be imposed between the IF GND and IF IN terminals.

An undesirable lack of linearity under strong r-f input signal conditions is forestalled by interrupting the application of base drive to Q3 and thus to Q4 from the RF IN terminal at the strong signal levels where distortion would otherwise be incurred at high percentage modulation. This is done by biasing the base electrode of Q3 to a quiescent potential, sufficiently less positive than its normally +2 $V_{BE}$ level, that the positive-swinging peaks of the r-f input signal at the RF IN terminal cannot bias the base-emitter junctions of Q3 and Q4 into conduction.

To carry out this way of interrupting base drive to Q3 and Q4, the following circuitry is included in the FIG. 1 r-f amplifier. Transistor Q14, receiving at its base the AGC voltage $V_{15}$ for the r-f amplifier, is provided with a second emitter to supply by emitter-follower action a translated AGC voltage to the base of NPN transistor Q20. Q20 is connected to an inverting amplifier stage to generate a collector $V_{CQ20}$ that is an amplified complement of the AGC voltage applied to its base. More particularly, Q20 is provided with a resistor R38 connecting its emitter to RF GND and with a resistor R39 connecting its collector to the +2 $V_{BE}$ potential provided at the interconnection of diodes D4 and D5. $V_{CQ20}$ is applied to the base of a NPN transistor Q21. Q21 has its collector connected to the base of Q1, so that the pinch resistor R25 is in effect its collector load resistance, and has a resistor R38 connecting its emitter to RF GND. R40 is made a pinch resistor so its resistance tracks that of R25, despite changes in the temperature of integrated circuit IC or in the absolute values of the resistors on IC. R25 is a pinch resistor to compensate against $h_{fe}$ variation of Q4 over the course of manufacture affecting its $g_m$ appreciably.

So long as the AGC voltage $V_{15}$ is above the +2 $V_{BE}$ voltage associated with weak and normal r-f input signal conditions, Q20 is biased into conduction to hold the base of Q21 so close in potential to that at RF GND that Q21 is maintained non-conductive. So Q21 does not affect the application of r-f input signal from terminal RF IN via R6 to the base of Q3. At strong r-f input signal levels where $V_{15}$ is reduced below +2 $V_{BE}$ to reduce the gain of the r-f amplifier to low levels, $V_{15}$ is insufficiently large to maintain conduction through the serially connected base-emitter junctions of Q14 and Q20. Accordingly Q20 is biased for non-conduction. The cessation of its collector current lessens the potential drop across R39 and permits the +2 $V_{BE}$ potential applied through R39 to and permits the +2 $V_{BE}$ potential applied through R39 to the base electrode of Q21 to forward-bias the base-emitter junction of Q21. This forward biasing is strong enough to place Q21 in saturated conduction, causing potential divider action between pinch resistors R25 and R40 to reduce the quiescent potential at the base of Q3 to somewhat less than one volt under strong signal conditions. R-f input signals at the RF IN terminal may swing up to peaks of about a volt before non-linearities associated with conduction of Q3 and Q4 are evidenced.

What is claimed is:
1. A voltage divider comprising:
a first terminal for receiving a reference voltage;
a second terminal for receiving a voltage to be divided;
a third terminal, between which and each of said first and second terminals respective divided voltages are available;
a fourth terminal for receiving an operating voltage;
a first transistor with a collector region, with a base region formed by a first diffusion into its collector region, followed by a second diffusion thereinto, with an emitter region formed by said second diffusion with a collector electrode contacting its collector region ohmically and connecting to said fourth terminal, with a base electrode contacting its base region ohmically, and with an emitter electrode contacting its emitter ohmically, one of its base and emitter electrodes connecting to said third terminal;
a first resistor with a body formed by said first diffusion process in a body of semiconductive material formed by the same process as the collector region of said first transistor, with a first electrode contacting its body ohmically and connecting to said first terminal, and with a second electrode contacting its body ohmically at a different point than its first electrode does and connecting to the emitter electrode of said first transistor; and a second resistor with a body formed by said first diffusion process in a body of semiconductor material formed by the same process as the collector region of said first transistor, and its body further formed by said second diffusion process, with a first electrode contacting its body ohmically and connecting to said second terminal, and with a second electrode contacting its body ohmically at a different point than its first electrode does and connecting to the base electrode of said first transistor.

2. A voltage divider as set forth in claim 1 wherein the emitter electrode of said first transistor connects to said third terminal.

3. A voltage divider as set forth in claim 2 in connection with the following elements to provide a regulator for the voltage between said first and fourth terminals;

a second transistor having a base electrode to which said third terminal connects, having an emitter electrode connected to said first terminal, and having a collector electrode connected to said fourth terminal; and means for applying between said first and second terminals a fixed portion of the voltage between said first and fourth terminals.

4. A regulator as set forth in claim 3 wherein said means for applying comprises:

a third resistor connected between said fourth and second terminals; and a fourth resistor connected between said second and first terminals.

5. A regulator as set forth in claim 4 in combination with an amplifier stage comprising:

a third resistor of the same type as said first resistor, having first and second ends;

a fourth resistor of the same type as said second resistor, having a first end connected to said fourth terminal and having a second end connected to the first end of said third resistor;

auxiliary voltage regulator means connected between the second end of said fourth resistor and said first terminal responding to the resulting current flow through said fourth resistor for developing a voltage substantially twice that across a forward-biased semiconductor;

third and fourth transistors having respective base and emitter and collector electrodes, the base electrode of said third transistor having the second end of said third resistor connected thereto, and the collector electrode of said third transistor being connected to said fourth terminal;

means for applying an input signal to the base electrode of said third transistor;

a fifth resistor of the same type as said first resistor, having a first end connected to said first terminal and having a second end connected to an interconnection of the emitter electrode of said third transistor and the base electrode of said fourth transistor;

conductance means between the emitter electrode of said fourth transistor and said first terminal;

load means to which the collector electrode of said fourth transistor connects, including a path for direct current between said fourth terminal and the collector electrode of said fourth transistor.

6. The combination set forth in claim 5 wherein said auxiliary voltage regulator means comprises:

a fifth transistor having an emitter electrode connected to said first terminal, having a collector electrode connected to the second end of said fourth resistor; and sixth and seventh resistors having respective first ends connected together and to the base electrode of said fifth transistor and having respective second ends respectively connected to said first terminal and to the second end of said fourth transistor.

* * * * *

UNITED STATES PATENT AND TRADEMARK OFFICE
CERTIFICATE OF CORRECTION

PATENT NO. : 4,295,088

DATED : October 13, 1981

INVENTOR(S) : Max Edward Malchow

It is certified that error appears in the above—identified patent and that said Letters Patent is hereby corrected as shown below:

Column 3, line 40, change "18" to --38--.

Column 6, line 12, that portion "divided by resistance, that VB+" in italics should be printed in regular type.

line 12, change "VB+" to --$V_{B+}$--.

Column 7, line 36, after "L1" insert --parallelled--.

Column 12, line 29, change "annd" to --and--.

Column 14, lines 33-34, delete "and permits the +2$V_{BE}$ potential applied through R39 to".

*Signed and Sealed this*

*Twenty-third* Day of *March 1982*

|SEAL|

*Attest:*

GERALD J. MOSSINGHOFF

*Attesting Officer*     *Commissioner of Patents and Trademarks*